United States Patent
Kodama et al.

(10) Patent No.: US 11,224,977 B2
(45) Date of Patent: Jan. 18, 2022

(54) CHUCK FOR HOLDING MOUNTING COMPONENT, AND COMPONENT MOUNTING MACHINE

(71) Applicant: FUJI CORPORATION, Chiryu (JP)

(72) Inventors: Jiro Kodama, Nagoya (JP); Yusuke Tsuchiya, Toyota (JP)

(73) Assignee: FUJI CORPORATION, Chiryu (JP)

( * ) Notice: Subject to any disclaimer, the term of this patent is extended or adjusted under 35 U.S.C. 154(b) by 44 days.

(21) Appl. No.: 16/646,305

(22) PCT Filed: Sep. 21, 2017

(86) PCT No.: PCT/JP2017/034002
§ 371 (c)(1),
(2) Date: Mar. 11, 2020

(87) PCT Pub. No.: WO2019/058470
PCT Pub. Date: Mar. 28, 2019

(65) Prior Publication Data
US 2020/0269444 A1    Aug. 27, 2020

(51) Int. Cl.
*B25J 15/08* (2006.01)
*H05K 13/04* (2006.01)

(52) U.S. Cl.
CPC .......... *B25J 15/08* (2013.01); *H05K 13/0452* (2013.01)

(58) Field of Classification Search
CPC . B25J 15/08; H05K 13/04; B65G 7/12; B66C 1/422
USPC ..................... 294/94, 93, 62, 106
See application file for complete search history.

(56) References Cited

U.S. PATENT DOCUMENTS

| | | | | | |
|---|---|---|---|---|---|
| 2,953,407 | A | * | 9/1960 | Cella | B65B 35/36 294/94 |
| 4,730,861 | A | * | 3/1988 | Spencer | B25J 15/022 294/106 |
| 5,503,446 | A | * | 4/1996 | De Jong | B25B 9/00 294/100 |
| 2010/0229380 | A1 | * | 9/2010 | Endo | H05K 13/0409 29/760 |
| 2011/0098840 | A1 | * | 4/2011 | Inaba | H05K 13/08 700/114 |
| 2013/0309057 | A1 | * | 11/2013 | Yasuda | B25J 15/0047 414/729 |
| 2017/0190515 | A1 | * | 7/2017 | Kuraoka | B65G 47/02 |

(Continued)

FOREIGN PATENT DOCUMENTS

JP    4-65220 U    6/1992
JP    6-24882 u    4/1994
(Continued)

OTHER PUBLICATIONS

International Search Report dated Dec. 26, 2017 in PCT/JP2017/034002 filed Sep. 21, 2017, 2 pages.

*Primary Examiner* — Paul T Chin
(74) *Attorney, Agent, or Firm* — Oblon, McClelland, Maier & Neustadt, L.L.P.

(57) ABSTRACT

A chuck for holding a mounting component including: multiple claw units each having multiple claws configured to contact a section to be held of a component to be mounted on a board, the claw units being arranged at predetermined positions separated from each other; and a claw unit opening and closing mechanism configured to open and close each of the multiple claw units.

5 Claims, 5 Drawing Sheets

(56) References Cited

U.S. PATENT DOCUMENTS

| | | | |
|---|---|---|---|
| 2019/0250180 A1* | 8/2019 | Pollack | B25J 15/02 |
| 2020/0114526 A1* | 4/2020 | Awada | B25J 15/08 |
| 2020/0214184 A1* | 7/2020 | Kito | H05K 13/0417 |
| 2020/0253103 A1* | 8/2020 | Takama | G06T 7/55 |

FOREIGN PATENT DOCUMENTS

| | | |
|---|---|---|
| JP | 2016-219474 a | 12/2016 |
| WO | WO 2013/140571 A1 | 9/2013 |

* cited by examiner

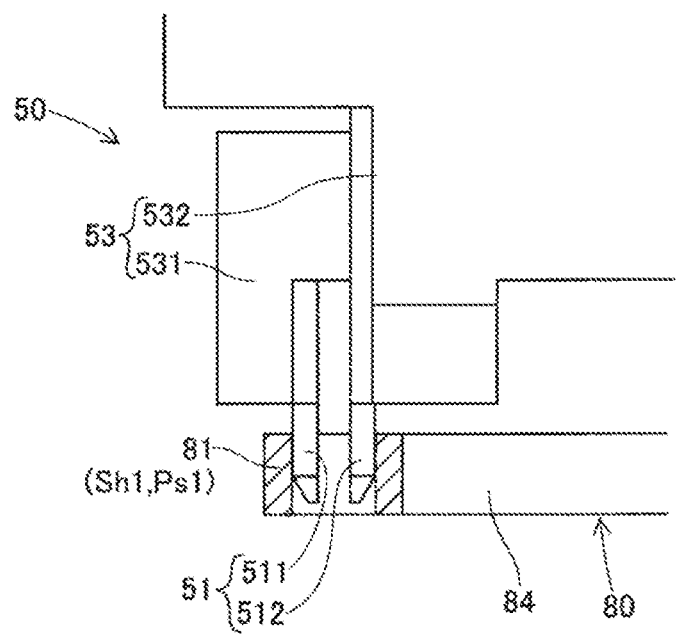

CHUCK FOR HOLDING MOUNTING COMPONENT, AND COMPONENT MOUNTING MACHINE

TECHNICAL FIELD

The present disclosure relates to a chuck for holding a mounting component and a component mounting machine.

BACKGROUND ART

A component mounting machine performs a mounting process for mounting a component on a circuit board. In the mounting process using a component mounting machine, the chuck for holding a mounting component clamps the component to be mounted using multiple claws (refer to patent literature 1). For the mounting process, a special chuck may be used depending on the type of the component.

CITATION LIST

Patent Literature

Patent literature 1: International publication WO2013/140571

BRIEF SUMMARY

Technical Problem

There is a demand for chucks to hold components more stably. Also, some components mounted to boards are flexible and can deform as a whole when clamped. In the case of holding such a component, it is desirable to suppress deformation of the component in a state in which the portion to be held of the component is clamped.

It is an object of the present specification to provide a mounting component holding chuck capable of holding a component more stably, and a component mounting machine including the chuck.

Solution to Problem

The present specification discloses a chuck for holding a mounting component including: multiple claw units each having multiple claws configured to contact a section to be held of a component to be mounted on a board, the claw units being arranged at predetermined positions separated from each other; and a claw unit opening and closing mechanism configured to open and close each of the multiple claw units.

The present specification discloses a component mounting machine including: the above chuck for holding a mounting component; and a control device configured to perform a mounting process for mounting the component held by the chuck for holding a mounting component to the board.

Advantageous Effects

According to the chuck for holding a mounting component having such a configuration, the component is held by being clamped by the multiple claw units corresponding to the multiple sections to be held of the component. Thus, compared to a configuration in which the component is clamped by one claw unit, the component is held more stably. Further, the multiple claw units are arranged at predetermined positions spaced apart from each other corresponding to the sections to be held of the component. As a result, even if the component is flexible and easily deformed, the multiple sections to be held are clamped, such that the component is held while suppressing deformation.

According to the component mounting machine having such a configuration, a component which is flexible and easily deformed by clamping can be a target of the mounting process. This makes it possible to save labor in manufacturing board products. In addition, since the chuck can stably hold the component, the moving speed of the chuck can be improved, and the time required for the mounting process can be shortened. As a result, productivity of board products can be improved.

BRIEF DESCRIPTION OF DRAWINGS

FIG. 5B is an enlarged side view showing a portion of the frame component and a claw unit in an open state (clamped state).

DESCRIPTION OF EMBODIMENTS

1. Embodiments

1-1. Configuration of Component Mounting Machine 1

Figure 1:
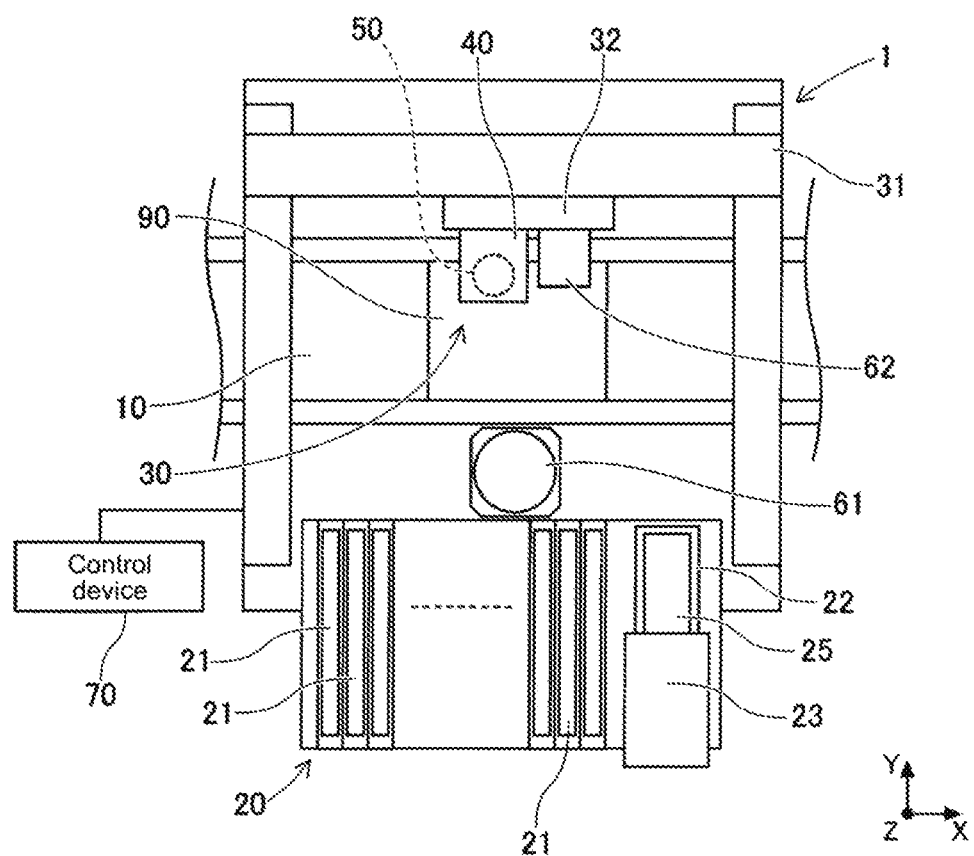
FIG. 1 is a plan view showing the configuration of a component mounting machine that performs a mounting process using the chuck for holding a mounting component of an embodiment.

As shown in FIG. 1, component mounting machine 1 is provided with board conveyance device 10, component supply device 20, component transfer device 30, component camera 61, board camera 62, and control device 70. Board conveyance device 10 is configured from a belt conveyor or the like and consecutively conveys boards 90 in a conveyance direction. Board conveyance device 10 loads board 90 inside component mounting machine 1, and positions board 90 at a predetermined position. Board conveyance device 10, after the mounting process of mounting the components by component mounting machine 1 is completed, unloads board 90 from component mounting machine 1.

Component supply device 20 supplies components to be mounted on board 90. Component supply device 20 includes multiple feeders 21 set lined up in the X-axis direction. Feeder 21 feeds carrier tape in which a large number of components are housed such that the components can be picked up at a supply position at the distal end of feeder 21. Further, component supply device 20 supplies relatively large components, such as leaded components and frame components described later, in a state arranged on tray 25 that is loaded on pallet 22. Component supply device 20 stores multiple pallets 22 in storage rack 23 divided in the vertical direction, and pulls forward a specified pallet 22 according to the mounting process so as to supply components such as leaded components.

Component transfer device 30 is provided with head driving device 31 and moving body 32. Head driving device 31 is configured to move moving body 32 in the XY-axis directions using a linear motion mechanism. Mounting head 40 is exchangeably fixed to moving body 32 by a clamp member (not shown). Mounting head 40 picks up a component supplied by component supply device 20 and mounts the component at a predetermined mounting position of board 90.

Figure 3:
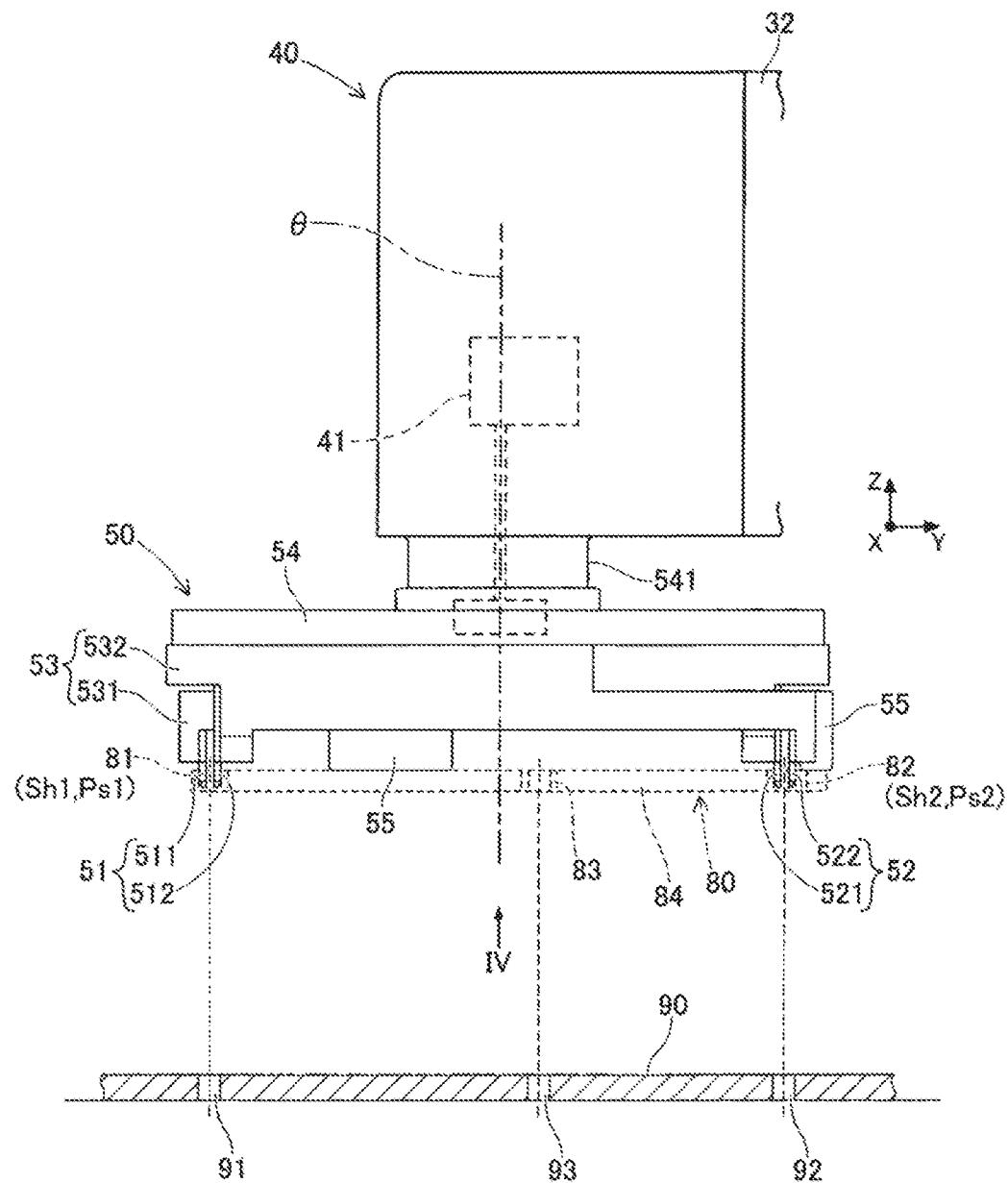
FIG. 3 is a side view showing the mounting head and chuck for holding a mounting component from FIG. 1, with a held frame component shown with broken lines.

One or multiple holding members are detachably provided on mounting head 40. The above holding member may be, for example, a suction nozzle that picks up a component via the supply of negative pressure, or a chuck for holding a mounting component (also referred to simply as "chuck") that clamps a component. In the present embodiment, as shown in FIG. 3, mounting head 40 supports one of the chucks 50 so as to be movable in the Z-axis direction and rotatable around the 0 axis that is parallel to the Z axis.

Mounting head 40 is connected to an air passage connected to air supply source 41 for supplying negative pressure air or positive pressure air via a switching valve (not shown) to a piston 56, and an air passage of chuck 50. By this, mounting head 40 supplies negative pressure air or positive pressure air to chuck 50. Air supply source 41 is configured by, for example, an air pump or the like provided inside mounting head 40. The detailed configured of chuck 50 is described later.

Component camera 61 and board camera 62 are digital cameras with an imaging element such as a charge coupled device (CCD) or a complementary metal oxide semiconductor (CMOS). Component camera 61 and board camera 62 perform imaging based on externally inputted control signals. Component camera 61 and board camera 62 transmit image data acquired by imaging.

As shown in FIG. 1, component camera 61 is fixed to the base of component mounting machine 1 such that the light axis faces upward in the Z-axis direction. Component camera 61 is configured to be able to capture an image from below of a component held by a holding member such as chuck 50. Board camera 62 is fixed to moving body 32 of component transfer device 30 such that the light axis faces down in the Z-axis direction, Board camera 62 is configured to be capable of capturing an image of board 90 from above.

Control device 70 is configured mainly from a CPU, various types of memory, and control circuits. In the mounting process of mounting components on board 90, control device 70 receives information outputted from various types of sensor provided in component mounting machine 1, and results of recognition processing by image processing or the like. Then, control device 70 transmits control signals to component transfer device 30 based on control programs, preset mounting conditions, and the like. As a result, the position and rotational angle of the holding member such as chuck 50 supported by mounting head 40 are controlled.

Specifically, control device 70 picks up the component supplied by component supply device 20 using a holding member such as chuck 50, and images the component using component camera 61. Control device 70 recognizes the orientation of the component with respect to the holding member based on the image data acquired by the imaging of component camera 61. Here, control device 70 recognizes the orientation of the component by, for example, recognizing a portion of the component or a characteristic portion of the external appearance of the component as a reference position for positioning with respect to board 90 by image processing.

Then, as shown in FIG. 3, control device 70 moves mounting head 40 above a predetermined position on board 90. Here, control device 70 corrects the position and angle of the holding member based on the orientation of the component recognized by the imaging process. Then, control device 70 lowers the holding member holding the component to mount the component on board 90. Control device 70 repeats this pick-and-place cycle as described above to perform the mounting process of mounting components on board 90.

1-2. Detailed Configuration of Mounting Component Holding Chuck 50

The type of chuck 50 is selected according to the component to be mounted, and chuck 50 is attached to mounting head 40 manually or automatically. The component to be mounted includes components accommodated in carrier tape loaded on feeder 21, leaded components supplied by being loaded side by side on tray 25, and relatively large-sized components such as frame component 80, which will be described later. In addition to the above, component supply device 20 may employ a configuration in which frame component 80 is accommodated in a cavity of carrier tape and supplied by feeder 21.

Figure 2:
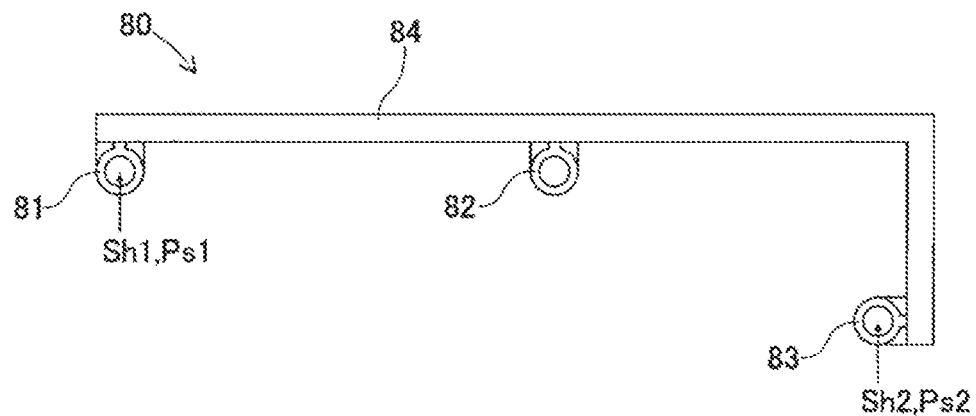
FIG. 2 is a plan view of a frame component.

Chuck 50 of the present embodiment is a dedicated holding member for frame component 80. As shown in FIG. 2, frame component 80 includes multiple hole sections 81 to 83 and frame main body 84. The multiple hole sections 81 to 83 are formed in a closed circular shape when viewed from above. When frame component 80 is mounted on board 90, the multiple hole sections 81 to 83 are linked with, for example, multiple connection holes 91 to 93 on board 90. Frame component 80 is joined to board 90 by, for example, screwing bolts passing through the multiple hole portions 81 to 83 to the multiple connections holes 91 to 93.

Frame main body 84 connects to the multiple hole sections 81 to 83. Further, frame main body 84 is flexible as a whole. The flexibility of frame main body 84 is determined by the material, cross-sectional area, cross-sectional configuration, and the like of which frame main body 84 is formed. On the other hand, the multiple hole sections 81 to 83 are stiffer than frame main body 84. In the present embodiment, frame main body 84 is formed in an L-shape when viewed from above. Hereinafter, multiple hole sections 81 to 83 of frame component 80 will be described as first hole section 81, second hole section 82, and third hole section 83 in the order of the left side, the right side, and the center of FIG. 2.

In the present embodiment, first hole section 81 and second hole section 82 are set to reference positions Ps1 and Ps2 for positioning with respect to board 90 to which frame component 80 is to be mounted. In the mounting process, control device 70 of component mounting machine 1 recognizes the positions of first hole section 81 and second hole section 82 of the held frame component 80 on the basis of image data obtained by imaging using component camera 61. Then, control device 70 recognizes the orientation of frame component 80 based on the position of reference positions Ps1 and Ps2 corresponding to first hole section 81 and second hole section 82, and corrects the position and angle of chuck 50.

Here, with a component having a relatively large and long main body, which includes frame component 80, for example, a flat part on the upper surface may not be large enough, and it may be difficult to hold the component by suction nozzle. Further, if a general-purpose chuck is configured to conform to the shape of frame component 80, the holding condition of frame component 80 may become unstable due to, for example, a shortage of the contact area between the multiple claws of the chuck and frame component 80. Further, the flexibility of frame main body 84 may cause frame component 80 to deform as a whole when clamped with multiple claws positioned to contact a remote location on frame component 80.

If frame component 80 is held in a deformed state, reference positions Ps1 and Ps2 set on frame component 80 may be displaced from their original positions. In such cases, if the recognition processing of the orientation of frame component 80 is performed based on the image data from the mounting process, the accuracy of the recognition processing may be lowered due to the deformation of frame component 80. For this reason, it is desired that chuck 50 securely holds a component while suppressing deformation of the component even if the component is a deformable component such as frame component 80.

Therefore, chuck 50 of the present embodiment adopts a configuration that enables chuck 50 to more stably hold frame component 80 while maintaining the original configuration of frame component 80 as described above. Specifically, chuck 50 respectively clamps and holds the two held sections Sh1 and Sh2 of frame component 80. Here, in the present embodiment, the two held sections Sh1 and Sh2 on frame component 80 are set as reference positions Ps1 and Ps2 of frame component 80. In other words, when chuck 50 holds frame component 80, chuck 50 clamps first hole section 81 and second hole section 82 corresponding to reference positions Ps1 and Ps2.

As shown in FIG. 3, chuck 50 includes multiple claw units 51 and 52, claw unit opening and closing mechanism 53 (hereinafter, simply referred to as "opening and closing mechanism 53"), chuck main body 54, and support section 55, The multiple claw units 51 and 52 are arranged at predetermined positions spaced apart from each other, and contact and clamp frame component 80, Hereinafter, the multiple claw units 51 and 52 will be referred to as first claw unit 51 and second claw unit 52 in order from the left side of FIG. 3.

First claw unit 51 has first claw 511 and second claw 512 that contact first hole section 81 as holding section Sh1 of frame component 80 to be mounted on board 90. Similarly, second claw unit 52 has third claw 521 and fourth claw 522 that contact second hole section 82 as holding section Sh2 of frame component 80 to be mounted on board 90. In the present embodiment, first claw unit 51 and the second claw unit 52 are two-claw units, and are opened and closed with the opening and closing direction being the longitudinal direction of frame component 80 (the left-right direction in FIG. 2).

Figure 6:
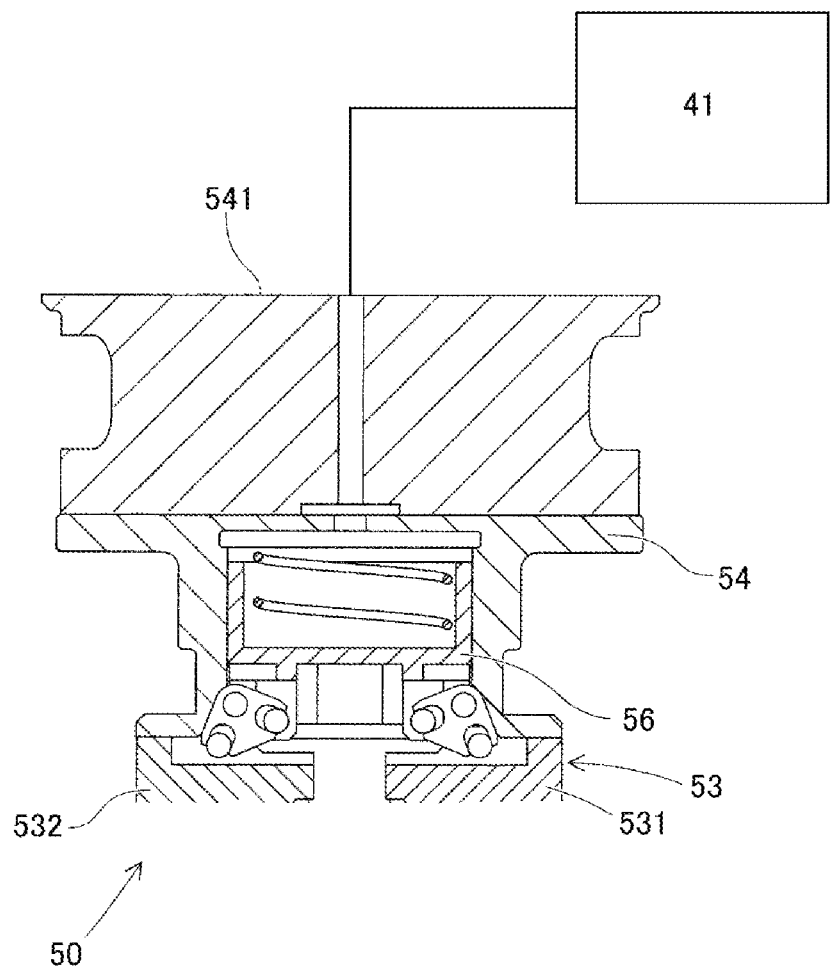
FIG. 6 is a side view of a portion of the chuck.

Opening and closing mechanism 53 opens and closes first claw unit 51 and second claw unit 52, respectively. In the present embodiment, opening and closing mechanism 53 includes first block 531 and second block 532 that are provided so as to be movable relative to each other in the horizontal direction (the left-right direction in FIG. 3). Opening and closing mechanism 53 moves a piston 56 from an initial position by negative pressure air or positive pressure air supplied to chuck 50, and first block 531 and second block 532 are moved in the horizontal direction in accordance with the movement of the piston. The piston 56 rotates the pair of cranks in different directions depending on the vertical position of the piston 56. The first block 531 and the second block 532 is moved in the horizontal direction according to the angle of the pair of cranks. When a negative pressure air is not supplied by the air supply source 41 to the chuck 50, the piston 56 is in a descending position, because the piston 56 is biased downward by a compression spring as shown FIG. 6. On the other hand, when a negative pressure air is supplied by the air supply source 41 to the chuck 50, the piston 56 is in an ascending position against the compression spring.

Here, first claw 511 of first claw unit 51 is connected to third claw 521 of second claw unit 52 by first block 531 of opening and closing mechanism 53 and integrally moves in the opening and closing direction. Similarly, second claw 512 of first claw unit 51 is connected to fourth claw 522 of second claw unit 52 by second block 532 of opening and closing mechanism 53 and integrally moves in the opening and closing direction. With such a configuration, opening and closing mechanism 53 causes first block 531 and second block 532 to move relative to each other in the horizontal direction, and causes first claw unit 51 and second claw unit 52 to open and close in conjunction with each other.

Chuck main body 54 supports first block 531 and second block 532 of opening and closing mechanism 53 so as to be horizontally movable by a rail (not shown). Further, cylindrical shaft 541 having an air passage formed therein is formed on an upper portion of chuck main body 54. Shaft 541 is a portion detachably attached to mounting head 40.

Figure 4:
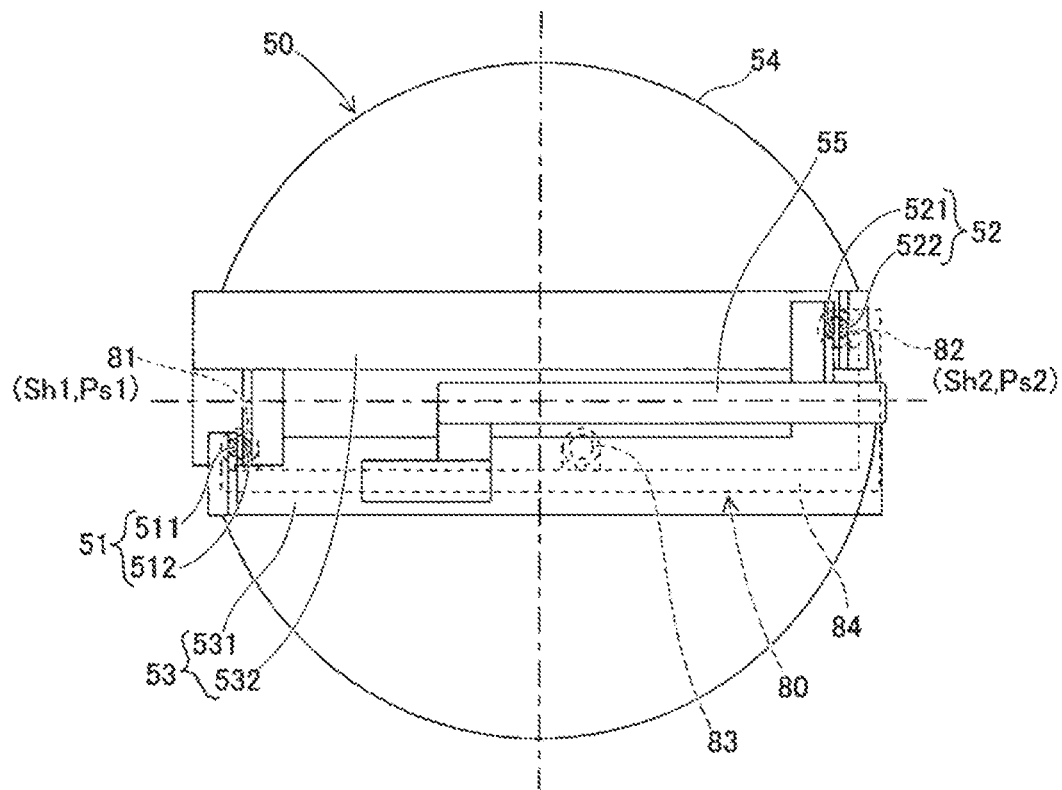
FIG. 4 shows the chuck for holding a mounting component from the IV direction in FIG. 3, with the held frame component shown with broken lines.

Support section 55 contacts the upper surface of frame component 80 held by first claw unit 51 and second claw unit 52, and supports frame component 80. More specifically, as shown in FIG. 4, support section 55 contacts and supports the upper surface of frame main body 84 between first hole section 81 and third hole section 83, and between second hole section 82 and the third hole section 83.

Here, in a non-linear component such as frame component 80 having an L-shaped overall shape, the center of gravity of the component tends to deviate from the straight line connecting the two held sections. With respect to this, by appropriately supporting frame component 80 using support section 55 configured as described above, the orientation of frame component 80 can be stabilized during pickup and mounting of frame component 80.

Note that, the portion supported by support section 55 can be appropriately set in accordance with the configuration or the like of frame component 80. Specifically, regarding frame component 80, support section 55 may be provided with a portion to contact corner sections of frame main body 84 or an upper surface of frame main body 84 corresponding to a connection position when frame component 80 is to be connected to board 90 via pre-applied connection material (such as solder paste). According to the above-described configuration, since the lower surface of the connection position on frame component 80 can be connected by pressure to the connection material, the reliability of the mounting operation can be improved.

1-3. Mounting Process by Component Mounting Machine 1

Figure 5A:
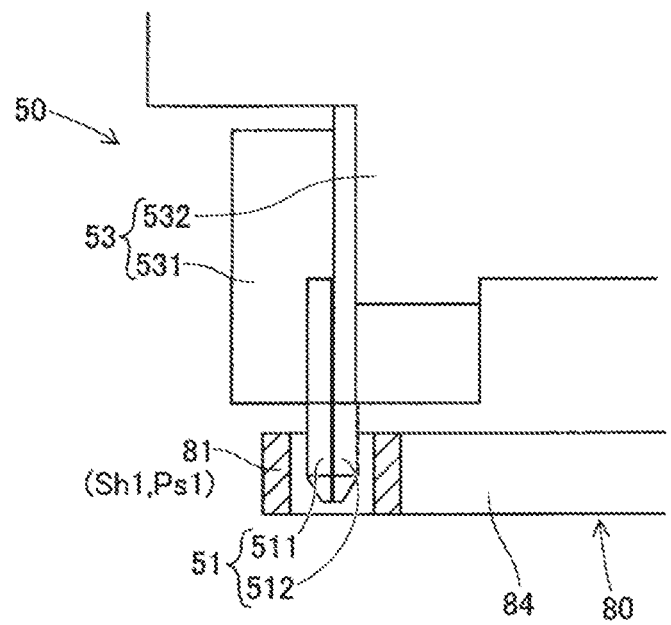
FIG. 5A is an enlarged side view showing a portion of the frame component and a claw unit in a closed state (unclamped state).

Operation of chucks 50 in the mounting process performed by component mounting machine 1 will be described referring to FIG. 3, FIG. 5A, and FIG. 5B, Here, it is assumed that chuck 50 dedicated to the frame component is attached to mounting head 40. Here, as described above, first claw unit 51 and second claw unit 52 of chuck 50 are respectively arranged at predetermined positions separated from each other.

Specifically, the predetermined positions are set to relative positions at which second claw unit 52 is positioned at a position corresponding to second hole section 82 (reference position Ps2) of frame component 80 when first claw unit 51 is positioned at a position corresponding to first hole section 81 (reference position Ps1) of frame component 80. In other words, first claw unit 51 and second claw unit 52 are arranged corresponding to first hole section 81 and second hole section 82, which are the two held portions Sh1 and Sh2 of frame component 80.

For pickup of frame component 80, control device 70 cuts off the negative pressure air supplied to chuck 50 to bring chuck 50 into an initially closed state (unclamped state). Next, control device 70 controls operation of mounting head 40 such that the tips of first claw unit 51 and second claw unit 52 are inserted into first hole section 81 and second hole section 82 of frame component 80 supplied by component supply device 20 (refer to FIG. 5A). Here, the lower surface of support section 55 contacts the upper surface of frame main body 84 of frame component 80.

Control device 70 supplies negative pressure air to chuck 50 to open chuck 50 (clamped state) as shown in FIG. 5B. Specifically, first claw unit 51 and second claw unit 52 move to the open state in conjunction with opening and closing mechanism 53 moving first block 531 and second block 532 in opposite directions. As a result, the outer peripheral surfaces of first claw 511 and second claw 512 of first claw unit 51 contact the inner peripheral surface of first hole section 81 of frame component 80. Similarly, the outer peripheral surfaces of third claw 521 and fourth claw 522 of second claw unit 52 contact the inner peripheral surface of second hole section 82 of frame component 80.

Thereafter, control device 70 controls the operation of mounting head 40 to raise chuck 50. As a result, frame component 80 clamped by chucks 50 is removed from tray 25 of component supply device 20. Here, since first claw unit 51 and second claw 512 are respectively arranged at the prescribed positions, first hole section 81 and second hole section 82 of frame component 80 are maintained with a positional relation as in the original shape of frame component 80. In addition, since first hole section 81 and second hole section 82 are stiffer than frame main body 84, they are hardly deformed even when an external force required for clamping is applied. This prevents frame component 80 from being deformed by clamping.

Subsequently, control device 70 moves chuck 50 clamping frame component 80 above component camera 61, and acquires image data by capturing an image using component camera 61. Control device 70 recognizes the holding state (a state including the presence or absence of the component and the orientation of the component) of frame component 80 held by chuck 50 based on reference positions Ps1 and Ps2 (first hole section 81 and second hole section 82) in the acquired image data. Control device 70 adjusts the position and angle of chuck 50 and, as shown in FIG. 3, moves mounting head 40 above a predetermined position on board 90.

Control device 70 lowers chuck 50 to mount frame component 80 on board 90. Here, support section 55 of chuck 50 contacts the upper surface of frame main body 84 of frame component 80 to press frame component 80 toward board 90. Control device 70 cuts off the negative pressure air supplied to chuck 50 to cause chuck 50 to be in an unclamped state. As a result, first claw unit 51 and second claw unit 52 are in a state separated from first hole section 81 and second hole section 82 of frame component 80. The control device 70 then raises chuck 50 to complete one pick-and-place cycle.

1-4. Effects of Embodiments

According to the above-described configuration, chucks 50 holds frame component 80 via clamping using multiple claw units (the first claw unit 51 and the second claw unit 52) corresponding to multiple held sections (first held section Sh1 and second held section Sh2) of frame component 80. This enables frame component 80 to be held more stably as compared with a configuration in which frame component 80 is clamped by one claw unit.

Further, first claw unit 51 and second claw unit 52 are respectively arranged at predetermined positions spaced apart from each other corresponding to held sections Sh1 and Sh2 of frame component 80. As a result, since the multiple held sections Sh1 and Sh2 of frame component 80, which is flexible and easily deformable, can be clamped, frame component 80 can be held while suppressing deformation.

Further, opening and closing mechanism 53 opens and closes first claw unit 51 and second claw unit 52 in conjunction with each other when putting frame component 80 in the clamped state or the unclamped state. According to such a configuration, the timings at which first claw unit 51 and second claw unit 52 come into contact with or release held section Sh1 and Sh2 of frame component 80 are close, thus maintaining the original shape of frame component 80 when holding and releasing frame component 80.

Further, first claw 511 of first claw unit 51 is connected to third claw 521 of second claw unit 52 and is integrally moved in the opening and closing directions. Similarly, second claw 512 of first claw unit 51 is connected to fourth claw 522 of second claw unit 52 and is integrally moved in the opening and closing directions. According to such a configuration, opening and closing mechanism 53 can open and close the multiple claw units, (first claw unit 51 and second claw unit 52) by relatively moving first block 531 and second block 532 that connect the claws. Thus, opening and closing mechanism 53 can be miniaturized, and the manufacturing cost can be reduced.

Also, chuck 50 includes support section 55 that contacts the upper surface of frame component 80 clamped and held by first claw unit 51 and second claw unit 52 to support frame component 80. According to such a configuration, it is possible to further stabilize the holding state of frame component 80. Further, when chuck 50 picks up frame component 80 and mounts it on board 90, support section 55 can press frame component 80 downward. Therefore, during pickup, the supplied frame component 80 can be clamped while the orientation thereof is stabilized. In addition, during mounting, frame component 80 to be mounted can be pressed onto board 90.

In the present embodiment, the component that is a holding target for chuck 50 is frame component 80 having frame main body 84 that is flexible and connects multiple hole sections 81 to 83. Such a frame component 80 is susceptible to deformation under the external force due to clamping. On the other hand, the multiple hole sections 81 to 83 do not deform much compared with frame main body 84. Therefore, by using first hole section 81 and second hole section 82 of the multiple hole sections 81 to 83 as held sections Sh1 and Sh2, it is possible to suppress deformation when an external force for clamping is applied. In the present embodiment, first hole section 81 and second hole section 82 have closed shapes, and thus have a configuration that does not deform easily in response to an external force for clamping.

Chuck 50 holds frame component 80 by opening multiple claw units 51 and 52 inserted into first hole section 81 and second hole section 82, respectively. According to such a configuration, for chuck 50, a space required for opening and closing the first claw unit 51 is maintained on the inner circumferential side of first hole section 81, and a space required for opening and closing the second claw unit 52 is maintained on the inner circumferential side of second hole section 82.

Thus, compared with general-purpose chucks that clamp the outer peripheral surface of frame component 80 in a closed state, first claw unit 51 and second claw unit 52 do not interfere with components and the like that have been mounted on board 90. Therefore, the mounting components including frame component 80 can be mounted on board 90 at high density. Accordingly, the degree of flexibility in designing the board product is improved, and the size of the board product can be reduced.

Further, control device 70 of component mounting machine 1 performs a mounting process for mounting frame component 80 held by chuck 50 having the above-described configuration to board 90. According to such a configuration, frame component 80 that is flexible and easily deformed by the clamps can be a target of the mounting process. This makes it possible to save labor in manufacturing board products. Further, since chuck 50 can stably hold frame component 80, the moving speed of chuck 50 can be improved, and the time required for the mounting process can be shortened. As a result, productivity of board products can be improved.

In the present embodiment, first claw unit 51 and second claw unit 52 are arranged corresponding to held sections Sh1 and Sh2 (first hole section 81 and second hole section 82) that are set as reference positions Ps1 and Ps2 of frame component 80, According to such a configuration, reference position Ps1 and Ps2 in the imaging process can be held and mounted such that the positions corresponds to predetermined positions of board 90. As a result, the accuracy of the mounting process can be improved.

2. Alternative Embodiments 2-1. Mounting Component Holding Chuck 50

In an embodiment above, opening and closing mechanism 53 of chuck 50 is configured to switch from the closed state (unclamped state) to the open state (clamped state) by being supplied with negative pressure air. However, opening and closing mechanism 53 of chuck 50 may be configured to open and close by being supplied with positive pressure air, or may be configured to open and close multiple claw units by being supplied with power, for example, in addition to air.

Further, first claw unit 51 and second claw unit 52 are both described as two-claw type units. However, first claw unit 51 and second claw unit 52 may have three or more claws. In an embodiment above, first claw 511 and third claw 521, and second claw 512 and fourth claw 522, are connected by first block 531 and second block 532, respectively, and move integrally in the opening and closing direction.

However, multiple claws may be configured such that a portion of the claws (for example, first claw 511 and third claw 521) are connected, and the remaining portion (for example, second claw 512 and fourth claw 522) are independently movable.

According such a configuration, the multiple claws connected can be moved integrally when opening and closing, and the configuration of opening and closing mechanism 53 can be simplified. In addition, since the chuck has claws which can move independently, it is possible to adjust the clamping state with respect to the held section of the component for each claw unit. However, from the viewpoint of simplifying the configuration of opening and closing mechanism 53 and reducing the size of the chuck, the example of the first embodiment is desirable.

Here, opening and closing mechanism 53 of chuck 50 may have an elastic member. For example, an elastic member having an elastic force such as rubber may be interposed at a connection portion between a piston moving by negative pressure air in opening and closing mechanism 53 and first block 531 and second block 532, Thus, when first claw unit 51 and second claw unit 52 hold frame component 80 by clamping, opening and closing mechanism 53 biases the multiple claws 511, 512, 521, and 522 to held sections Sh1 and Sh2 (first hole section 81 and second hole section 82) of frame component 80 by the elastic force of the elastic member.

According to such a configuration, since the multiple claws are biased to holding sections Sh1 and Sh2 with an elastic force, the frictional force between the claws and held sections Sh1 and Sh2 is improved, and frame component 80 is securely held. Note that, as the above-mentioned elastic member, a material such as a resin can be used instead of rubber, or a spring can be used. Further, from the viewpoint of biases the claws to held sections Sh1 and Sh2 as described above, a configuration in which the claw is formed of materials having elasticity or a configuration in which an elastic member is provided on the outer peripheral surface of the claw may be adopted.

2-2. Mounting Components

In an embodiment above, the mounting component to be held by chuck 50 is frame component 80 having an L-shaped overall shape. However, various shapes of frame component may apply. Specifically, the frame component may have a straight shape, a U-shape, a closed rectangular shape, or the like in addition to an L-shape. For frame components such as described above, the application of external clamping forces tends to deform the component, thus the application of a chuck that holds the component using multiple claw units is particularly useful.

Further, in addition to frame components, the mounting component may be any component capable of being held by being clamped at multiple held sections by a chuck provided with multiple claw units. Further, if space required for opening and closing the claw unit can be secured on the outer peripheral side of the mounting component, the held section may be clamped with the claw unit in the closed state. However, from the viewpoint of preventing interference between the claw and other mounting components and mounting the mounting components at high density, the example of the first embodiment is desirable.

REFERENCE SIGNS LIST

1: component mounting machine;
50: chuck (chuck for mounting component);
51: first claw unit;

511: first claw;
512: second claw;
52: second claw unit;
521: third claw;
522: fourth claw;
53: opening and closing mechanism (claw unit opening and closing mechanism);
54: chuck main body;
55: support section;
70: control device;
80: frame component;
81: first hole section;
82: second hole section;
83: third hole section;
84: frame main body;
Sh1: first held section;
Sh2: second held section;
Ps2: reference position;
90: board

The invention claimed is:

1. A chuck for holding a mounting component comprising:
  multiple claw units each having first and second claws configured to contact a section to be held of a component to be mounted on a board, the multiple claw units being arranged at predetermined positions separated from each other;
  a first block which is connected to the first claws of each of the multiple claw units, and a second block which is connected to the second claws of each of the multiple claw units, the first and second block being movable relative to each other horizontally so as to open and close the first and second claws of each of the multiple claw units; and
  a support section configured to support the component by directly contacting an upper surface of the component being held by the multiple claw units, the support section being provided on one of the first block and the second block.

2. The chuck for holding a mounting component according to claim 1, wherein
  the component is a frame component including multiple hole sections as the section to be held, and a frame main body that is flexible and configured to link to the multiple hole sections.

3. The chuck for holding a mounting component according to claim 2, wherein
  the chuck for holding a mounting component is configured to hold the component by making the multiple claw units be in an open state while respectively inserted into the multiple hole sections.

4. A component mounting machine comprising:
  the chuck for holding a mounting component according to claim 1; and
  a control device configured to perform a mounting process for mounting the component held by the chuck for holding a mounting component to the board.

5. The component mounting machine according to claim 4, wherein
  multiple of the sections to be held are set as reference positions for determining a position with respect to the board on which the component is to be mounted, and each of multiple of the claw units are arranged corresponding to the sections to be held of the component set as the reference positions.

* * * * *